(12) United States Patent
Fröjdh et al.

(10) Patent No.: US 6,801,668 B2
(45) Date of Patent: Oct. 5, 2004

(54) METHOD OF COMPRESSING DATA BY USE OF SELF-PREFIXED UNIVERSAL VARIABLE LENGTH CODE

(75) Inventors: Per Fröjdh, Stockholm (SE); Rickard Sjöberg, Tumba (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 647 days.

(21) Appl. No.: 09/811,068

(22) Filed: Mar. 16, 2001

(65) Prior Publication Data

US 2002/0176633 A1 Nov. 28, 2002

Related U.S. Application Data

(60) Provisional application No. 60/257,072, filed on Dec. 20, 2000.

(51) Int. Cl.[7] .............................. G06K 9/36; H03M 7/00
(52) U.S. Cl. .......................................... 382/246; 341/59
(58) Field of Search .............................. 341/59, 65, 67, 341/79; 382/232, 233, 244, 245, 246, 251, 253; 375/240.01, 240.16, 240.23; 348/384, 1, 390.1, 402.1

(56) References Cited

U.S. PATENT DOCUMENTS

| 3,694,813 | A | | 9/1972 | Loh et al. ................. 340/172.5 |
| 4,813,056 | A | | 3/1989 | Fedele ........................... 375/27 |
| 4,918,523 | A | * | 4/1990 | Simon et al. .......... 375/240.23 |
| 5,225,832 | A | * | 7/1993 | Wang et al. .................... 341/67 |
| 5,298,896 | A | | 3/1994 | Lei et al. ....................... 341/51 |
| 5,301,032 | A | * | 4/1994 | Hong et al. .................. 382/250 |
| 5,625,355 | A | * | 4/1997 | Takeno et al. ................. 341/67 |
| 5,912,636 | A | | 6/1999 | Gormish et al. ................ 34/50 |
| 6,046,774 | A | * | 4/2000 | Heo et al. .............. 375/240.16 |
| 6,097,757 | A | * | 8/2000 | Boice et al. ................. 375/240 |
| 6,483,543 | B1 | * | 11/2002 | Zhang et al. ............ 348/390.1 |
| 6,647,060 | B1 | * | 11/2003 | Ueda ..................... 375/240.02 |

FOREIGN PATENT DOCUMENTS

| EP | 0 732 854 A2 | 9/1996 |
| EP | 0 907 288 A2 | 4/1999 |

OTHER PUBLICATIONS

European Patent Office Standard Search Report, File No. RS 106716, Oct. 29, 2001, pp. 1–2.

Hartung, F. et al., "Improving Encoding of DCT Coefficients for Low Bit–Rate Video Coding Using Multiple VLC Tables," Proceedings 1999 International Conference on Image Processing. ICIP '99. Kobe, Japan, Oct. 24–28, 1999, International Conference on Image Processing, Los Alamitos, CA: IEEE, US, vol. 2 of 4, Oct. 24, 1999, pp. 51–55.

Bjontegaard, G. (Editor); "H.26L Test Model Long Term No. 5 (TML–5) draft 0."; ITU Telecommunications Standardization Sector, Study Group 16, Video Coding Experts Group (Question 15); Document Q15–K–59; Filename: q15k59dl.doc; Generated: Oct. 25, 2000; Eleventh Meeting: Portland, Oregon, USA, Aug. 22–25, 2000, pp. 1–35.

* cited by examiner

Primary Examiner—Andrew W. Johns
Assistant Examiner—Amir Alavi

(57) ABSTRACT

Disclosed is a method of compressing data contained in variable length or universal variable length code words to be carried in a digital bitstream. The method includes formatting a first set of code words for data and then constructing a second set of code words containing code words from the first set as well as concatenations of code words from the first set. Code words from the second set are to carry data in compressed form in the digital bitstream. One way in which the concatenation is accomplished includes selecting a code word from said first set of code words and applying it as a prefix to itself and to all of the other words in the first set, thereby constructing the second set. The code word selected from the first set for application as a prefix may be the shortest code word of the first set.

10 Claims, 1 Drawing Sheet

METHOD OF COMPRESSING DATA BY USE OF SELF-PREFIXED UNIVERSAL VARIABLE LENGTH CODE

RELATED APPLICATIONS

This application claims priority from and incorporates herein by reference the entire disclosure of U.S. Provisional Application Ser. No. 60/257,072, filed Dec. 20, 2000.

BACKGROUND OF THE PRESENT INVENTION

1. Field of the Invention

This invention relates to data compression and, in particular, compression of digital video.

2. Background of the Invention

As used herein, data compression refers to the process of representing data formatted as a sequence of symbols by fewer bits or bytes than needed by the original format. This can be achieved by using a variable length code (VLC) where frequently occurring symbols are represented by shorter code words than less frequent ones. In this way the average code word can be kept at minimum length and compression is achieved.

One way of finding an efficient VLC is to use the well-known Huffman coding algorithm, which matches code word lengths to the probability distribution of symbol occurrences. In the ideal case, the probability of a symbol should equal $2^{-k}$ where k is the bit length of the code word. For k=1, 2, 3, ..., this corresponds to probabilities 0.5, 0.25, 0.125, etc. The Huffman algorithm tries to match as many symbols as possible with the closest of these ideal probabilities. However, it is often the case that the original data symbols can be categorized into two different sets or types, where each type has a probability distribution of its own. By designing a separate code word table and accompanying VLC for each such symbol type, one can reduce the statistical variance. This gives a more efficient compression than using the overall distribution for all symbols disregarding their types.

Alternatively, one may use a single VLC—here referred to as a universal VLC (UVLC)—for all symbol types to be coded. Such a UVLC is typically constructed from an infinite pattern providing code words corresponding to a rather dense set of probabilities. The symbols are then coded by assigning the best code word for each symbol. If the symbols have an appropriate probability distribution, one may obtain the same performance as using a Huffman table.

When more than one VLC is used to compress data, it is of course essential that both the encoder and the decoder refer to the same VLC for each code word. This can be taken care of implicitly by following a certain standardized coding scheme. As an example, the ITU-T Recommendation H.263 for video coding uses different VLCs for different types of symbols. By correctly decoding the bitstream, the decoder is at any point aware of which type the following symbol will belong to, and hence which VLC to use.

Also for the case when a UVLC is used (instead of different VLCs) it is often possible to increase compression. This can be done by transforming symbols within types to obtain a better match to the probability distribution implied by the UVLC. One example is to merge symbols when the most probable symbol occurs too frequently. An example of this in video coding is the coding of macroblock modes where the skip mode occurs very frequently. By coding the modes of two adjacent macroblocks with one codeword, a better match to the VLC may be achieved.

However, a disadvantage of using a UVLC is the possible loss of coding efficiency as compared with using multiple VLCs. Among the features and advantages of the present invention is a way of reducing such loss of coding efficiency.

SUMMARY OF THE INVENTION

In accordance with the invention, and as illustrated in FIG. 1, a method of compressing data contained in variable length or universal variable length code words to be carried in a digital bitstream is provided. Starting from a first set of code words, the method includes the construction of a second set of code words consisting of code words from the first set as well as concatenations of code words from the first set. The concatenation comprises selecting a code word from the first set of code words and applying it as a prefix to itself and to all of the other words in the first set, thereby constructing the second set. Code words from said second set which has been constructed are used to carry data in compressed form in the digital bitstream.

The concatenation is preferably done by selecting a code word from the first set of code words and applying it as a prefix to itself and an optional prefix to all of the other words in said first set, resulting in said second set. This way each code word of the first set appears with and without prefix in the second set. The only exception is the code word selected as prefix, which does not appear in the second set on its own.

In another preferred embodiment, the said second set consists of 1) the selected code word concatenated with itself n times and all combinations of 2) the selected code word concatenated with itself between 0 and n−1 times followed by a concatenation with one of the other code words of said first set.

A further preferred method in accordance with the invention as described above is one in which code words of said first set comprise:

1
0x1
0x0x1
0x0x0x1, etcetera, where x is either 0 or 1, and the prefix is chosen to be the code word 1 and in which code words of said second set comprise:

11
0x1
10x1
0x0x1
10x0x1, etcetera.

Code words from said first set may be used to carry data in the bitstream in addition to words from the second set. The decision on what code word set to use may be signaled explicitly in the bitstream or it may be decided implicitly based on previously transmitted information or lack thereof.

In accordance with the invention, the bitstream carrying compressed data may be used in video and still image compression where the previously sent information consists of quantizer and/or picture type and/or coefficient values and/or motion vector information and/or block type.

DETAILED DESCRIPTION OF THE PRESENTLY PREFERRED EXEMPLARY EMBODIMENTS

Figure 1:
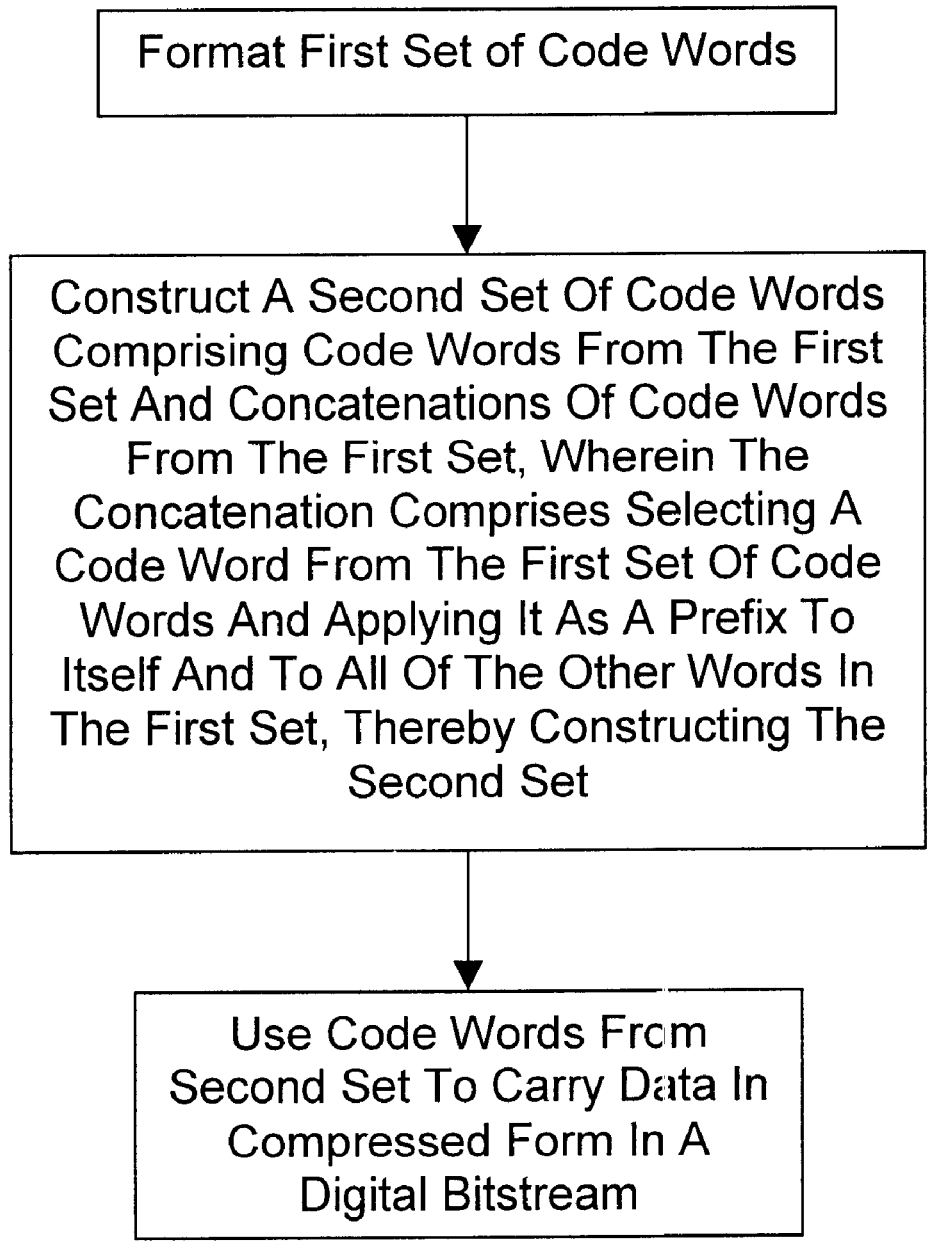
FIG. 1 illustrates a flowchart of an exemplary embodiment of a method of compressing data contained in variable length code words to be carried in a digital bitstream.

The present invention is particularly useful with the UVLC mentioned above. It can be more fully understood by referring to Table 1 and the discussion which follows.

The first nine code words of the example UVLC.
We also list the corresponding ideal probabilities of
occurrence as given by the code word lengths.

| Index | Code Word | Ideal prob. |
|---|---|---|
| 0 | 1 | 0.5 |
| 1 | 001 | 0.125 |
| 2 | 011 | 0.125 |
| 3 | 00001 | 0.03125 |
| 4 | 00011 | 0.03125 |
| 5 | 01001 | 0.03125 |
| 6 | 01011 | 0.03125 |
| 7 | 0000001 | 0.0078125 |
| 8 | 0000011 | 0.0078125 |

This UVLC can be written in shorthand notation as:

1
0x1
0x0x1
0x0x0x1
0x0x0x0x1 where each x can be either 0 or 1.

There are two main advantages of using this UVLC:1) only one VLC implies a simple design; 2) the code words are designed to resynchronize fast after bit errors.

However, there is one general disadvantage of using a UVLC rather than many VLCs. Although one has the freedom to assign code words (which may represent single symbols or combinations thereof) individually for each symbol type, one is still constrained by the distribution of code word lengths provided by the UVLC. This poses restrictions on how well the statistical distributions can be reflected. In contrast, by using several VLCs, one has a higher degree of freedom to reflect the different distributions, thus increasing the potential for efficient compression.

The present invention provides a way to increase the compression efficiency of the example UVLC by forming a new statistical distribution of code words, while still keeping the advantages of using only symbols from the original UVLC.

One characteristic and advantage of the example UVLC in Table 1 concerns error resilience: after a mistake due to a bit error, the data stream will quickly resynchronize and restore the decoding of code words.

As has been mentioned, a disadvantage of using a UVLC is the possible loss of coding efficiency as compared with the use of multiple VLCs. The present invention is a way of reducing such loss of coding efficiency.

In accordance with the invention, coding efficiency is assured by the construction of a new set of code words by using the shortest original code word as an optional prefix to the rest of the words. In order to be able to distinguish all code words from each other, the new index 0 code word must have a prefix. Applying optional single or double prefixing to the example UVLCs gives the following table:

TABLE 2

The example UVLC and the compound single-prefix and double-prefix UVLCs

| Index | UVLC | UVLC2 | UVLC3 |
|---|---|---|---|
| 0 | 1 | 11 | 111 |
| 1 | 001 | 001 | 001 |
| 2 | 011 | 011 | 011 |
| 3 | 00001 | 1001 | 1001 |
| 4 | 00011 | 1011 | 1011 |
| 5 | 01001 | 00001 | 11001 |
| 6 | 01011 | 00011 | 11011 |
| 7 | 0000001 | 01001 | 00001 |
| 8 | 0000011 | 01011 | 00011 |
| 9 | 0001001 | 100001 | 01001 |
| 10 | 0001011 | 100011 | 01011 |

Even more prefixes may be used thus increasing the possible new code-length distributions.

If an encoder switches between a prefixed code word table and the original one, the outputted bitstream will still consist of only original code words, since the prefixed table is made by concatenation of original words. This means that the error-resilient properties of the first or original set of code words are preserved, while the encoder has the possibility to switch to the prefixed table(s) when this gives a better match to the current symbol probability distribution. Which table to use can be signaled in the bitstream, but it is generally better to set up rules based on previously transmitted information to decide which code word table to use (implicit switching).

All prefixed code words of the example compound UVLC, except index 0, will be shorter than or of same length as the corresponding original code words. For the index 0 symbol there will be a loss of one bit in the number of saved bits for UVLC2 and two bits for UVLC3 (see Table 2), whereas for most of the symbols with higher indices there will be a gain of one or two bits. This new technique is not necessarily a complete replacement for the symbol transformation of the prior art but may be more useful as a complement.

From the foregoing it can be seen that the present invention provides a simple, versatile and powerful technique for attaining data compression in a bitstream.

Although the invention has been described with reference to specific embodiments, various modifications and alternatives exist which were not described, but which are within the scope and spirit of the invention. Accordingly, the invention should be limited only by the following claims.

What is claimed is:

1. A method of compressing data contained in variable length code words to be carried in a digital bitstream comprising:
   formatting a first set of code words for data;
   constructing a second set of code words comprising code words from the first set and concatenations of code words from the first set, wherein said concatenation comprises selecting a code word from said first set of code words and applying it as a prefix to itself and to all of the other words in said first set, thereby constructing said second set; and
   using code words from said second set to carry data in compressed form in said digital bitstream.

2. A method in accordance with claim 1 in which said code word selected from said first set for application as a prefix is the shortest code word of the first set.

3. A method in accordance with claim 1, in which said second set comprises 1) the said selected code word concatenated with itself n times and all combinations of 2) the said selected code word concatenated with itself between 0 and n−1 times followed by a concatenation with one of the other code words of said first set.

4. A method in accordance with claim 1 in which code words of said first set comprise:

1
0x1
0x0x1
0x0x0x1, etcetera, where x is either 0 or 1, and the prefix is chosen to be the code word 1 and in which code words of said second set comprise:

11
0x1
10x1
0x0x1
10x0x1, etcetera.

5. A method in accordance with claim 1 in which code words from said first set are used to carry data in said bitstream in addition to said words from said second set.

6. A method in accordance with claim 5 in which the decision on what code word set to use is signaled explicitly in the bitstream.

7. A method in accordance with claim 5 in which the decision on which set of code words is to be used is decided implicitly based on previously transmitted information or lack thereof.

8. A method in accordance with claim 1 in which said bitstream is used in video and still image compression where the previously sent information consists of quantizer and/or picture type and/or coefficient values and/or motion vector information and/or block type.

9. A method in accordance with claim 1 in which said prefix has at least one character.

10. A method in accordance with claim 9 in which said prefix has two or more characters.

* * * * *